United States Patent [19]
Matsuda et al.

[11] Patent Number: 6,062,874
[45] Date of Patent: May 16, 2000

[54] IC SOCKET FOR IC PACKAGE

[75] Inventors: Eiji Matsuda, Sakura; Shigeru Sato, Yotsukaido; Yoshiharu Ishii, Yokohama, all of Japan

[73] Assignee: Yamaichi Electronics Co., Ltd., Tokyo, Japan

[21] Appl. No.: 09/149,130

[22] Filed: Sep. 8, 1998

[51] Int. Cl.[7] .................................................. H01R 12/00
[52] U.S. Cl. ............................................. 439/73; 439/331
[58] Field of Search .............................. 439/70, 72, 73, 439/331, 525

[56] References Cited

U.S. PATENT DOCUMENTS

| | | | |
|---|---|---|---|
| 4,887,969 | 12/1989 | Abe | 439/73 |
| 4,984,991 | 1/1991 | Nishimoto | 439/72 |
| 5,154,619 | 10/1992 | Matsuoka | 439/72 |
| 5,395,254 | 3/1995 | Mogi | 439/70 |
| 5,518,426 | 5/1996 | Plainer | 439/70 |
| 5,641,945 | 6/1997 | Abe et al. | 439/70 |

*Primary Examiner*—Renee S. Luebke
*Assistant Examiner*—T. C. Patel
*Attorney, Agent, or Firm*—Wenderoth, Lind & Ponack, L.L.P.

[57] ABSTRACT

In an IC socket in which IC leads of an IC package are pressed down by a presser member so as to be contacted with and retained by contacts arranged on the socket, an IC socket for an IC package comprises an IC mount which is upwardly and downwardly movably interposed between the socket and the presser member. The IC mount is formed with through-holes or through-grooves, and the contacts each having a vertical slit are inserted into the through-holes or through-grooves. The IC leads of the IC package placed on the IC mount are pressed down together with the IC mount by the presser member such that distal end portions of the contacts are relatively protruded upwardly from the through-holes of the IC mount as the IC leads are pressed down, so that the IC leads are pushed into the vertical slits.

5 Claims, 12 Drawing Sheets

IC SOCKET FOR IC PACKAGE

BACKGROUND OF THE INVENTION

This invention relates to an IC socket for an IC package having IC leads laterally projecting from an IC body.

Figure 12:
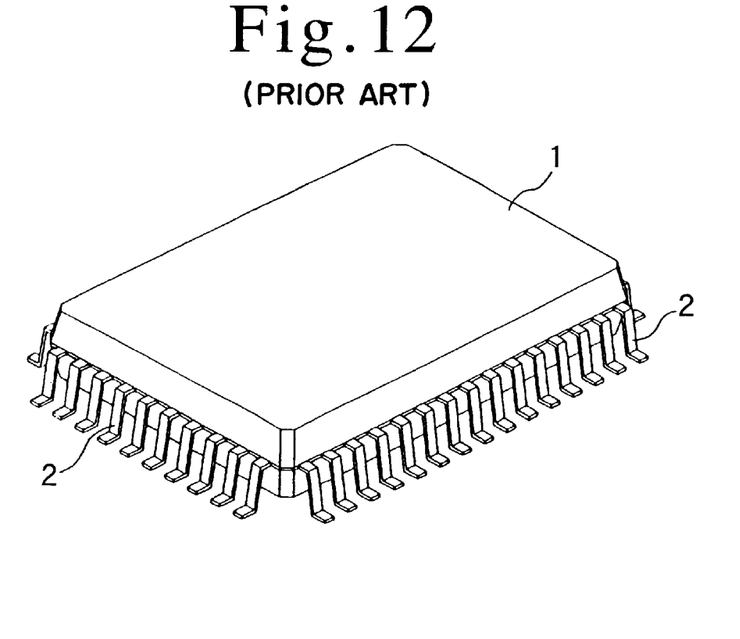
FIG. 12 is a perspective view showing one example of the flat type IC package.
Figure 13:
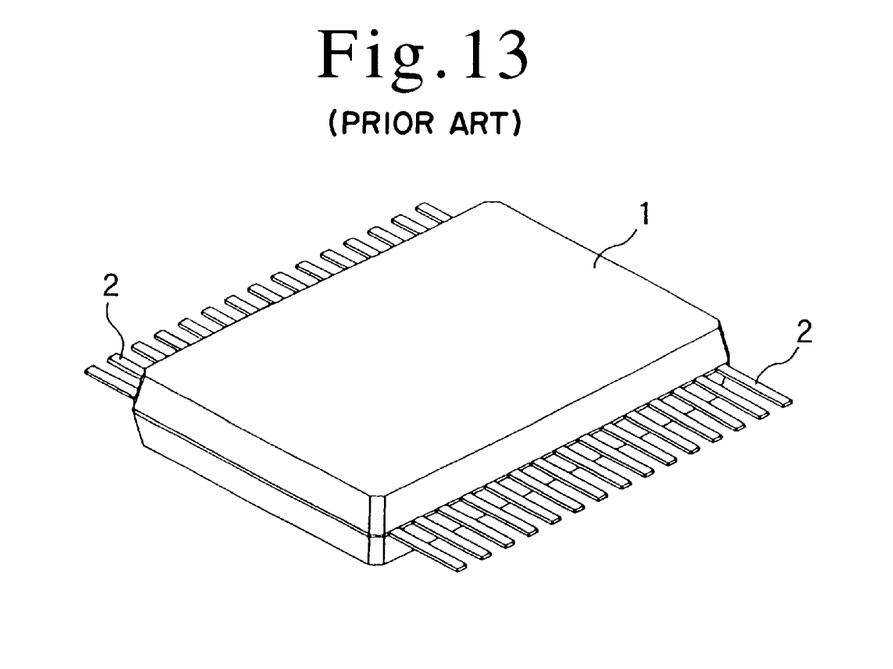
FIG. 13 is a perspective view showing another example of the flat type IC package.

There are, in view of the form of leads, two types of IC packages in which IC leads project laterally from the side surfaces of the IC body; one is shown in FIG. 12 in which IC leads 2 folded twice project laterally from the side surfaces of the body of the IC package 1, and the other is shown in FIG. 13 in which generally linear IC leads 2 project laterally from the side surfaces of the IC package 1.

Figure 14:
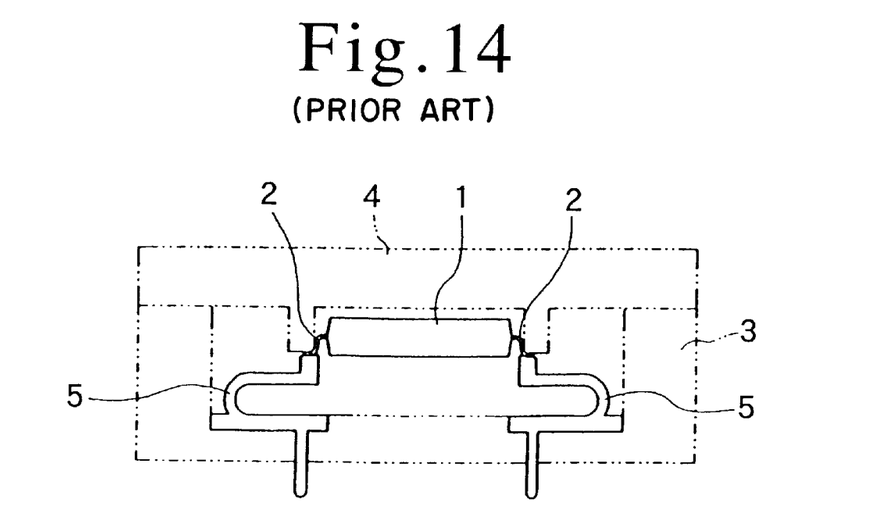
FIG. 14 is a side view for explaining a contact structure between a flat type IC package and a socket according to the prior art.

Those IC packages are connected to a wiring board, etc. through an IC socket. A contacting structure between the IC socket and the IC package is, as shown in FIG. 14, such that the IC leads 2 are placed on horizontal U-shaped resilient contact elements of corresponding contacts 5 arranged on the socket 3 and the IC leads 2 are pressed downwardly by a presser member 4 to cause deflection of the resilient contact elements, so that a reaction can be obtained by the contacting pressure.

The conventional IC sockets for IC packages have the inconvenience that the IC leads may become displaced relative to the contacts, thus making the IC leads unable to contact the corresponding contacts. Furthermore since an upward force is normally applied to the resilient contact element of each contact, it is necessary to maintain a state where a press-down force is normally applied to each lead by the presser member. This causes the presser member to be warped to reduce the reliability of the contacting relationship.

Moreover, since each contact of the IC socket has abundant vertical resiliency, the lateral spring length of the horizontal U-shaped resilient element must be long enough. As a consequence, since a signal line length (i.e. length of conductor along which the signal must travel) is inevitably increased, an inductance component is increased thus making such arrangement unable to recent requirements for high frequency signals. Accordingly, the conventional socket cannot be used for such high frequency signals.

In addition, since a lateral spring length of each contact is increased, the socket is inevitably enlarged in an extending direction of the spring portion and therefore, the mounting efficiency onto a wiring circuit, etc. is degraded. Solutions to these problems are demanded by users.

The present invention has been accomplished in view of the above problems inherent in the conventional devices.

SUMMARY OF THE INVENTION

It is, therefore, an object of the present invention to provide an IC socket for an IC package, in which IC leads of the IC package are positively contacted with and retained by contacts of the socket, a presser member is prevented from being warped, and the IC package can easily be removed from the socket.

To achieve the above object, there is essentially provided in an IC socket in which IC leads of an IC package are pressed down by a presser member so as to be contacted with and retained by contacts arranged on the socket, an IC socket for an IC package comprising an IC mount upwardly and downwardly movably interposed between the socket and the presser member. The IC mount is formed with through-holes or through-grooves, and the contacts each have a vertical slit and are inserted into the through-holes or through-grooves. The IC leads of the IC package placed on the IC mount are pressed down together with the IC mount by the presser member such that distal end portions of the contacts are caused to protrude upwardly from the through-holes of the IC mount as the IC leads are pressed down, so that the IC leads are pushed into the vertical slits.

In a state in which the IC mount is pressed down, distal ends of the contacts may be projected from the through-holes or through grooves of the IC mount and upper ends of the vertical slits of the contacts may be open on the IC mount to define lead inlet ports.

It is preferred that the presser member is formed with receiving grooves for receiving the distal ends of the contacts which are relatively protruded upwardly from the through-holes of the IC mount as the IC leads are pressed down into the vertical slits.

It is also preferred that an insertion depth of the IC leads into the vertical slits is set by supporting a-lower surface of the IC mount by a mount supporting seat of the socket when the IC mount is pressed downwardly.

In another aspect of the present invention, there is also provided in an IC socket in which IC leads of an IC package are pressed down by a presser member so as to be contacted with and retained by contacts arranged on the socket, an IC socket for an IC package comprising an IC mount, which is not mechanically contacted with (i.e. not fixed to) the socket and the presser member, the IC mount being upwardly and downwardly movably interposed between the socket and the presser member, and the contacting and retaining state being released by pushing the IC mount upwardly.

It is preferred that the socket is provided with a mount engagement portion for guiding upward and downward movements of the IC mount by allowing a corner portion of the IC mount to be brought into sliding engagement therewith, so that upward and downward movements of the IC mount are restricted when the mount engagement portion is brought into sliding contact with the comer portion.

It is also preferred that the IC mount or the socket is provided with a tool tip receiving portion for pushing the IC mount upwardly.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DETAILED DESCRIPTION OF THE EMBODIMENT

One preferred embodiment of the present invention will now be described with reference to the accompanying drawings.

In the following description, some terms indicative of particular directions, such as the terms "upward" and "downward" as referred to in connection with various component members and elements of the embodiments shown are used merely for purposes of description with reference to the drawings.

Figure 1:
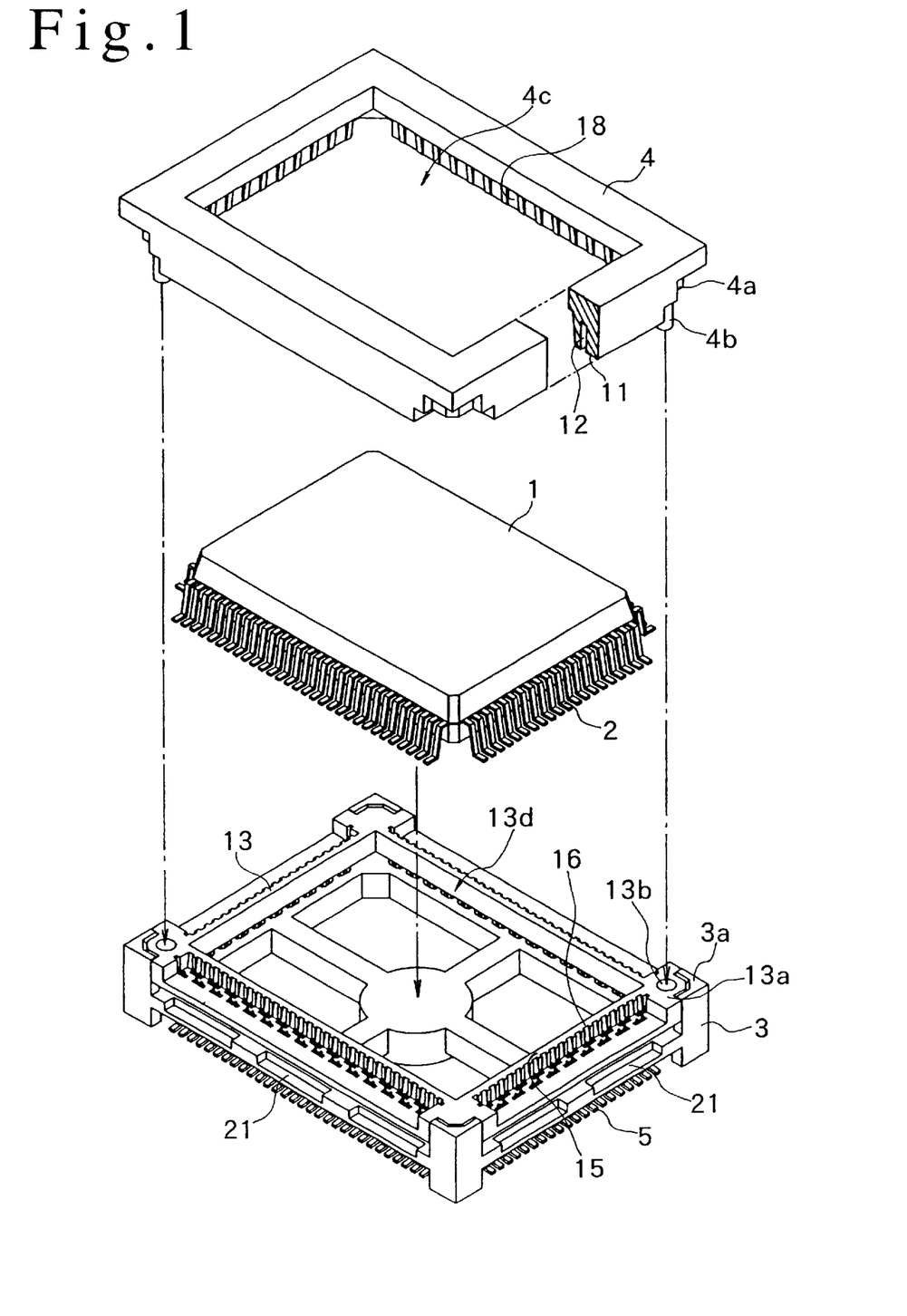
FIG. 1 is a perspective view of an IC socket for an IC package according to one embodiment of the present invention, showing a state in which a flat type IC package and a presser portion are not yet mounted on the socket.

FIG. 1 shows a flat type IC package 1 having IC leads 2 which are folded twice, a socket 3 engaged with an IC mount 13, and a presser member 4 in an exploded manner, and FIGS. 2 to 8 show the process for assembling those component parts and causing the IC leads 2 to be contacted with and retained by contacts 5 implanted in the socket 3 by pressing down the IC leads 2 with the presser member 4.

There are two types of the flat type IC packages, as exemplified in FIGS. 12 and 13, respectively. Either one of the flat type IC packages 1 has a plurality of IC leads 2 laterally projecting from either the four side surfaces or two opposite side surfaces of the IC package 1 as shown in FIGS. 12 and 13. There is also one, though not shown, in which a plurality of IC leads 2 project only from one side surface of the IC package 1.

Figure 2:
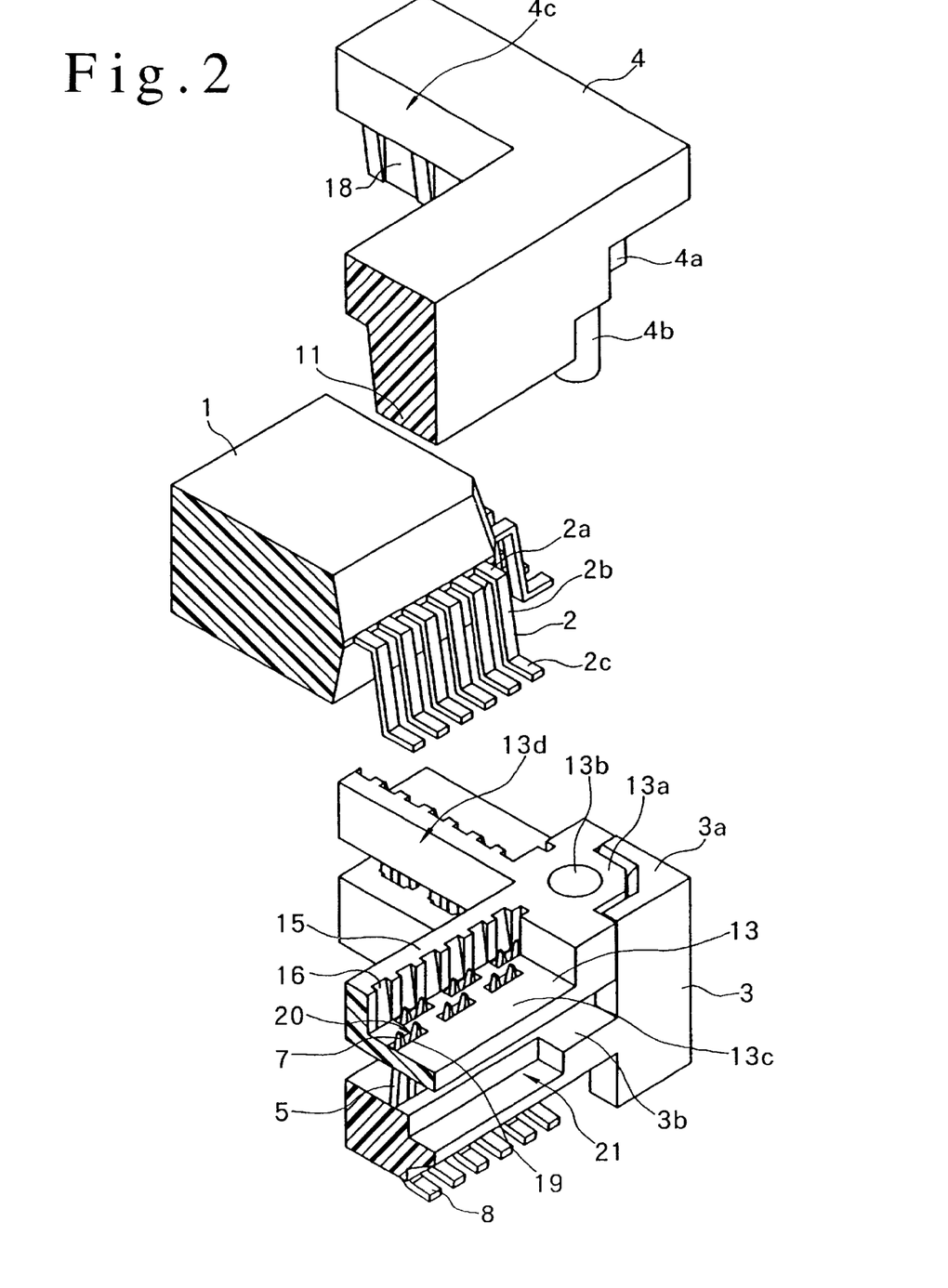
FIG. 2 is a perspective view showing an essential portion of FIG. 1 on an enlarged scale.

The IC socket 3 has the plurality of contacts 5 arranged in such a manner as to correspond to the IC leads 2. For example, as shown in FIGS. 1 and 2, a body of the IC socket 3 is formed of a square frame which is made of insulating material. The contacts 5 are implanted in array in this frame.

Figure 5A:
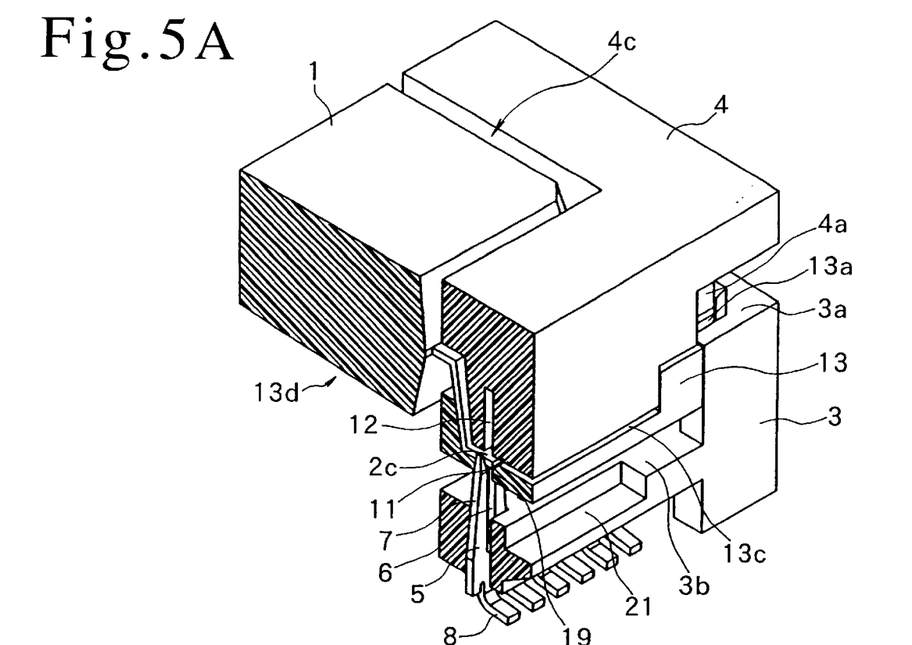
FIG. 5(A) is a perspective view showing an essential portion on an enlarged scale when the presser member is mounted on the socket and placed on the IC mount.

As shown in FIGS. 5(A) and (B), 8 and 9(A) and (B), as well as elsewhere, each of the contacts 5 has a vertical slit 6 and a pair of resilient contact elements 7 extending vertically and defining the slit 6. Upper ends of the resilient elements 7 are free ends, while lower ends thereof are connected. The resilient contact elements 7 have a plurality of surface mounting elements 8 projecting downwardly of the frame from the connecting portion. Accordingly, the vertical slits 6 are open at upper ends thereof and closed at lower ends thereof.

Figure 5B:
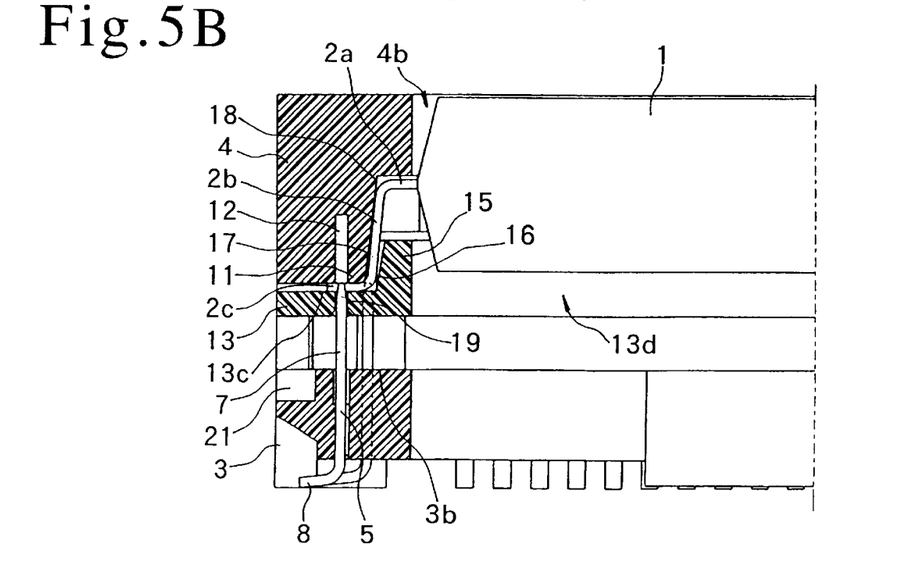
FIG. 5(B) is a sectional view of FIG. 5(A), both FIGS. 5(A) and 5(B) showing, states where the IC mount is not yet lowered.
Figure 6A:
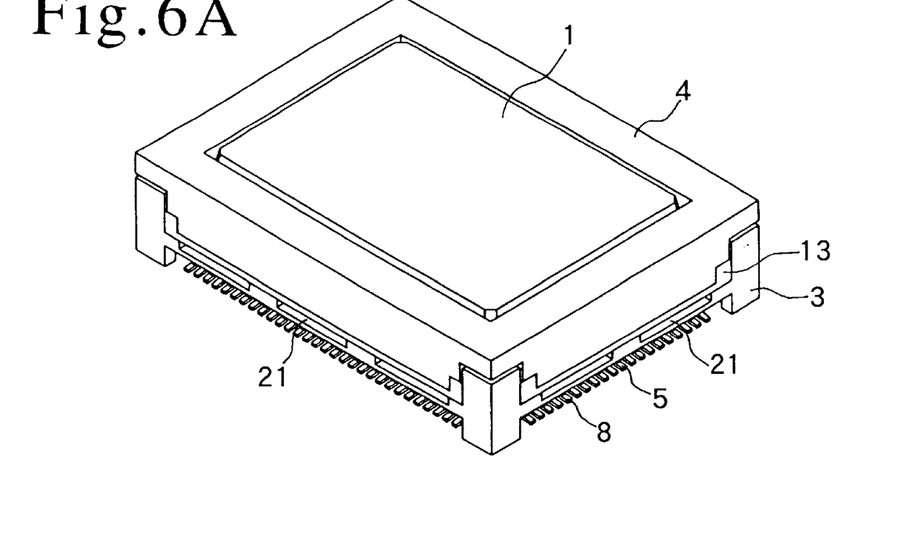
FIG. 6(A) is a perspective view showing an outer appearance when the IC leads are pressed down together with the IC mount by the presser member.
Figure 6B:
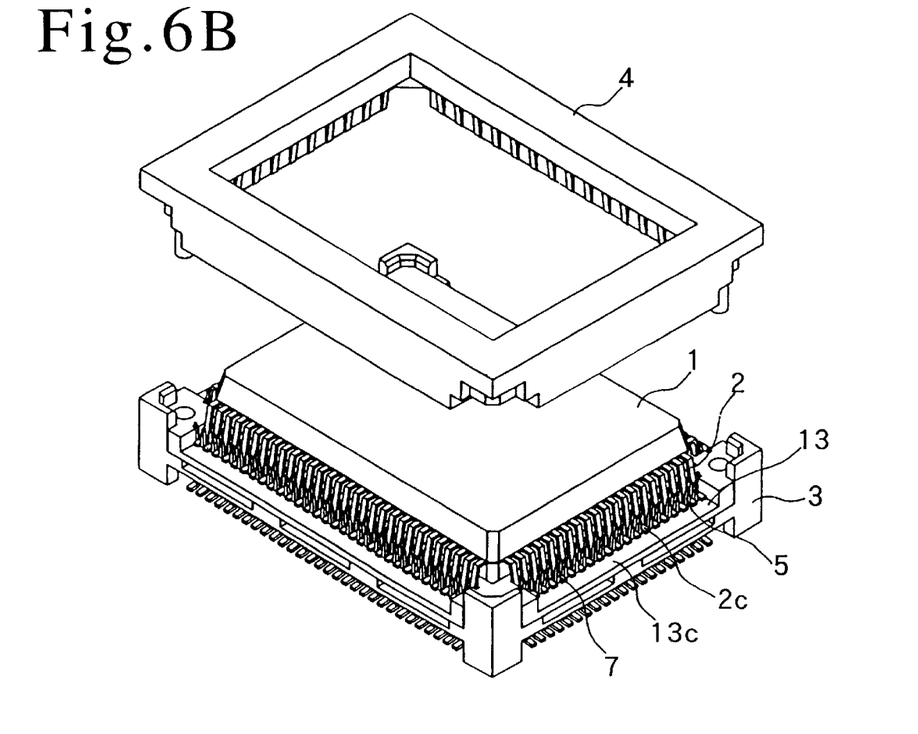
FIG. 6(B) is a perspective view showing an outer appearance by removing the presser member when the IC leads are pushed into vertical slits of contacts by pressing the presser member downwardly.
Figure 9A:
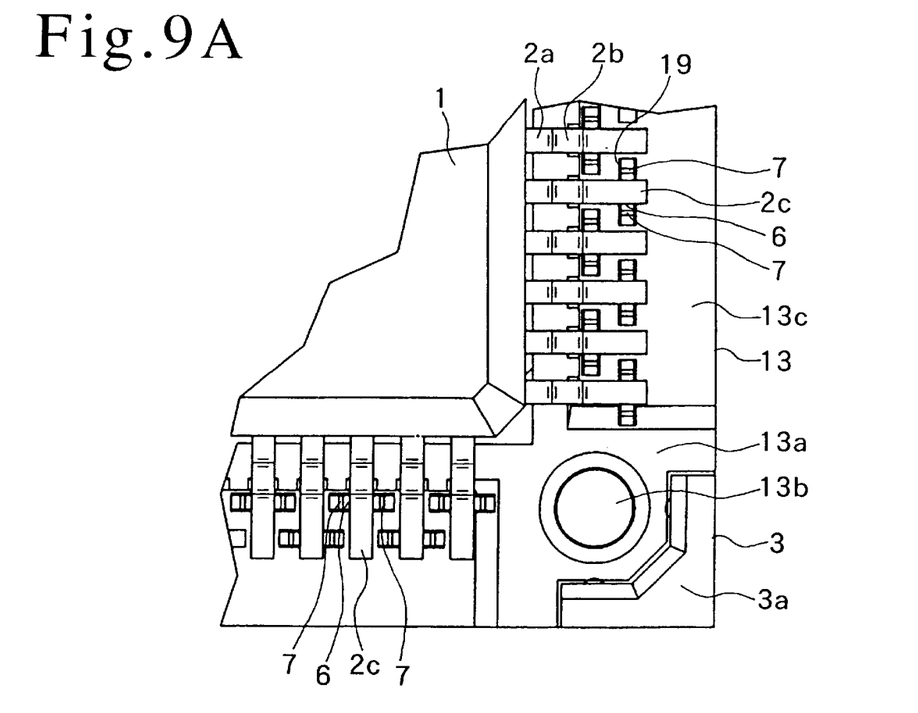
FIG. 9(A) is an enlarged plan view showing a state where the IC leads are pushed into the vertical slits of the contacts, by removing the presser member.
Figure 9B:
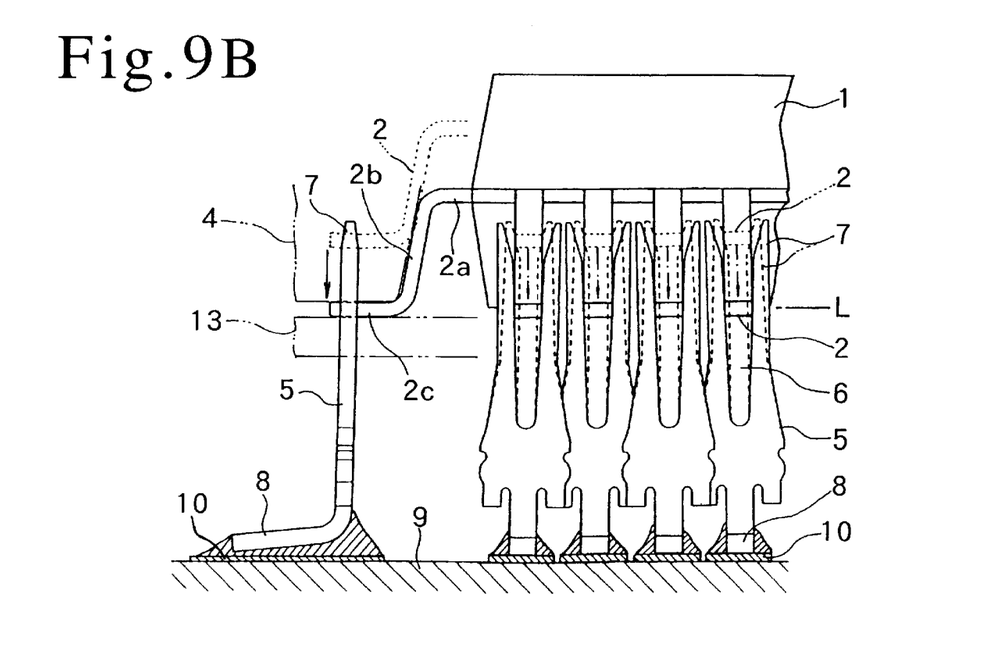
FIG. 9(B) is a side view for explaining the process for pushing the IC leads into the contacts.

Each of the contacts 5 is implanted in the socket with its connecting portion press fitted in the frame forming the socket body. The resilient contact elements 7 defining the vertical slit 6 project upwardly of the frame and as shown in FIG. 5, as well as elsewhere, the surface mounting element 8 is allowed to project downwardly of the frame and bent outwardly to form an L-shape along a lower surface of the frame. As shown in FIG. 9(B), an end portion of the bent portion is subjected to surface mounting with a conductive pad 10 disposed on a wiring circuit board 9. This surface mount element 8 is inserted for electrical connection into a through-hole formed in the wiring circuit board 9.

As shown in FIG. 1, as well as elsewhere, the pressure member 4 is formed of a square frame made of insulating material and a lead presser portion 11 is integrally formed on a lower surface of the frame. The lead presser portion 11 having a narrow width extends along each frame element, i.e., along each side of the presser member 4 so that it can press the array of the IC leads 2 as one group.

Between the socket 3 and the presser member 4, the IC mount 13 for supporting lower surfaces of the IC leads 2 is interposed so as to be movable upwardly and downwardly relative to the socket 3. The IC mount 13 is formed of a square frame made of insulating material. A lead supporting seat 13c having a flat surface is formed on an upper surface of the frame.

The IC mount 13 is upwardly and downwardly movably interposed between the socket 3 and the presser member 4, instead of being mechanically connected to them, through a spring, a pin, or the like, so that the IC mount 13 can freely be attached to and detached from the presser member 4 and the socket 3.

Specifically, as shown in FIG. 2, a socket engagement portion 13a is provided on each corner portion of the frame forming the IC mount 13. Each corer portion of the socket engagement portion 13a is brought into sliding contact with a mount engagement portion 3a provided on each corner of the socket 3, so that upward and downward movements of the IC mount 13 are restricted and upward and downward movements of the IC mount 13 are guided by bringing each comer portion of the socket engagement portion 13a into sliding contact with the mount engagement portion 3a. That is, by applying a press-down force or a push-up force (external force) to the IC mount 13, the IC mount 13 is caused to slide upwardly and downwardly while being guided by the mount engagement portion 3a of the socket 3. After the force is released, upward and downward movements of the IC mount 13 are prevented by the friction of the sliding contact so that the push-up state or the push-down state can be maintained.

On the other hand, the corner portions of the frame forming the presser member 4 are provided with a socket engagement portion 4a, and the socket engagement portion 4a is provided with a positioning pin 4b projecting downwardly from a lower surface thereof. When the presser member 4 is pressed down, the socket engagement portion 4a slidably engages with the mount engagement portion 3a of the socket 3. This sliding contact serves to prevent upward and downward movements of the presser member 4 while guiding such upward and downward movements.

In this way, the presser member 4 and the IC mount 13 are brought into superimposing relation while relatively positioning the presser member 4 and the IC mount 13 by inserting the positioning pin 4b of the presser member 4 into a hole 13b formed in the socket engagement portion 13a. By doing so, the presser member 4 and the IC mount 13 are caused to move upwardly and downwardly in unison with respect to the socket 3 by the sliding contact. By removing the positioning pin 4b from the hole 13b of the socket engagement portion 13a, the presser member 4 can freely be attached to and detached from the IC mount 13.

A plurality of through-holes 19 or through-grooves are formed in the IC mount 13. Those holes or grooves 19 are open at the lead supporting seat 13c of the frame. Distal ends of the contacts 5 arranged on the socket 3 are inserted into the corresponding holes or grooves 19. Slant surfaces 7a are formed on the distal ends of the resilient contact elements 7 and cause the end portion of the vertical slit 6 to gradually dilate toward the open end of the slit 6, for each contact 5. An IC lead inlet port 20 is formed by the opening between the two slanted surfaces 7a.

As shown in FIG. 2, in a state where the IC mount 13 is not yet pressed down, the distal ends of the contacts 5 are allowed to project from the through-holes 19 or through-grooves so as to be located in a higher position than the lead supporting seat 13c, and the lead inlet ports 20 are open with the upper ends of the vertical slits 6 of the contacts 5 located above the lead supporting seat of the IC mount 13.

Each of the IC leads 2 includes a basal portion 2a slightly laterally projecting from a side surface of the IC package 1, an intermediate portion 2b extending downwardly from one end portion of the basal portion 2a and a distal end portion 2c projecting laterally from a lower end of the intermediate portion 2b.

Figure 3:
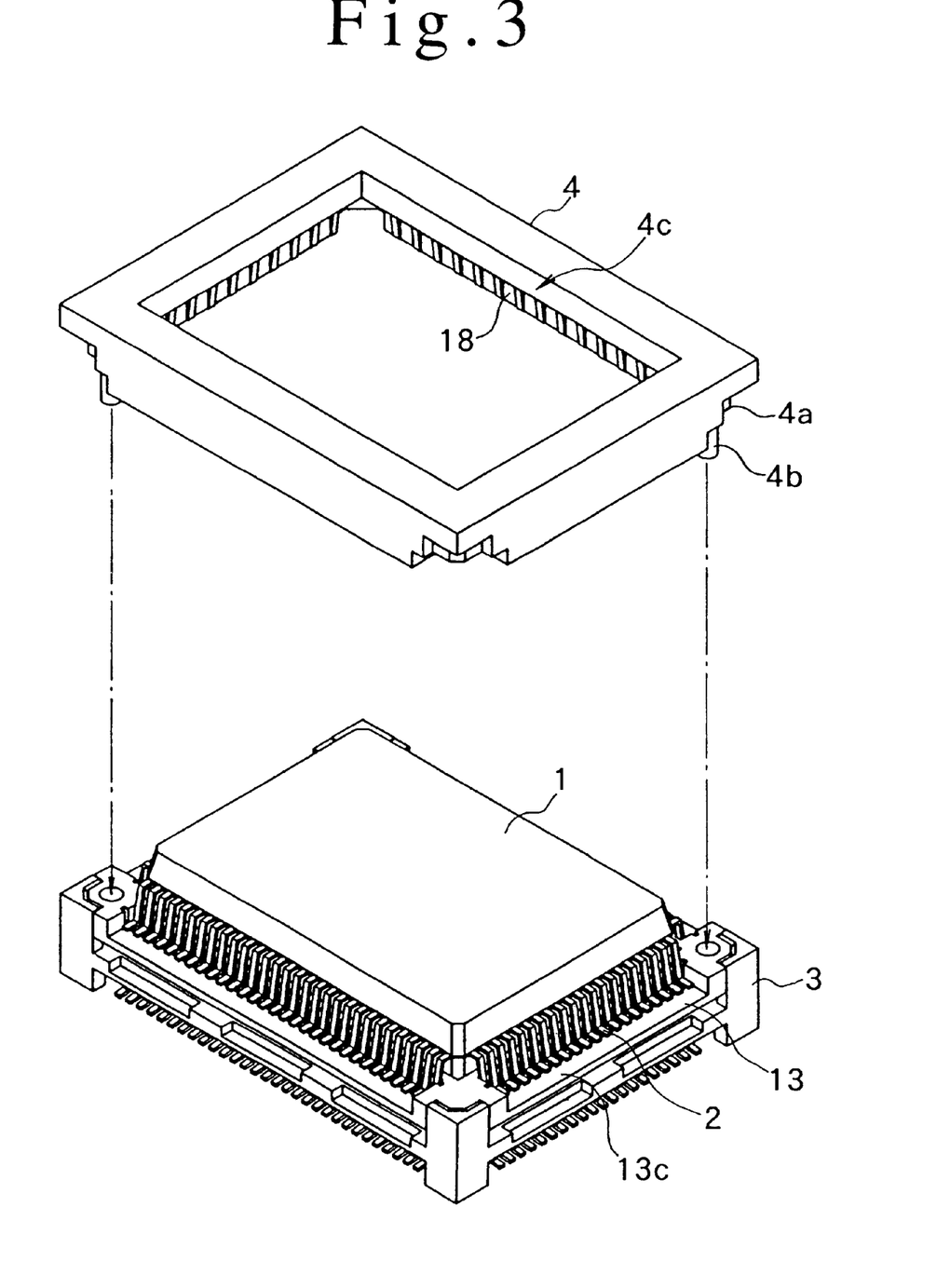
FIG. 3 is a perspective view of an IC socket for an IC package, in which the flat type IC package of FIG. 1 is placed on an IC mount and the IC mount is not yet lowered.
Figure 4:
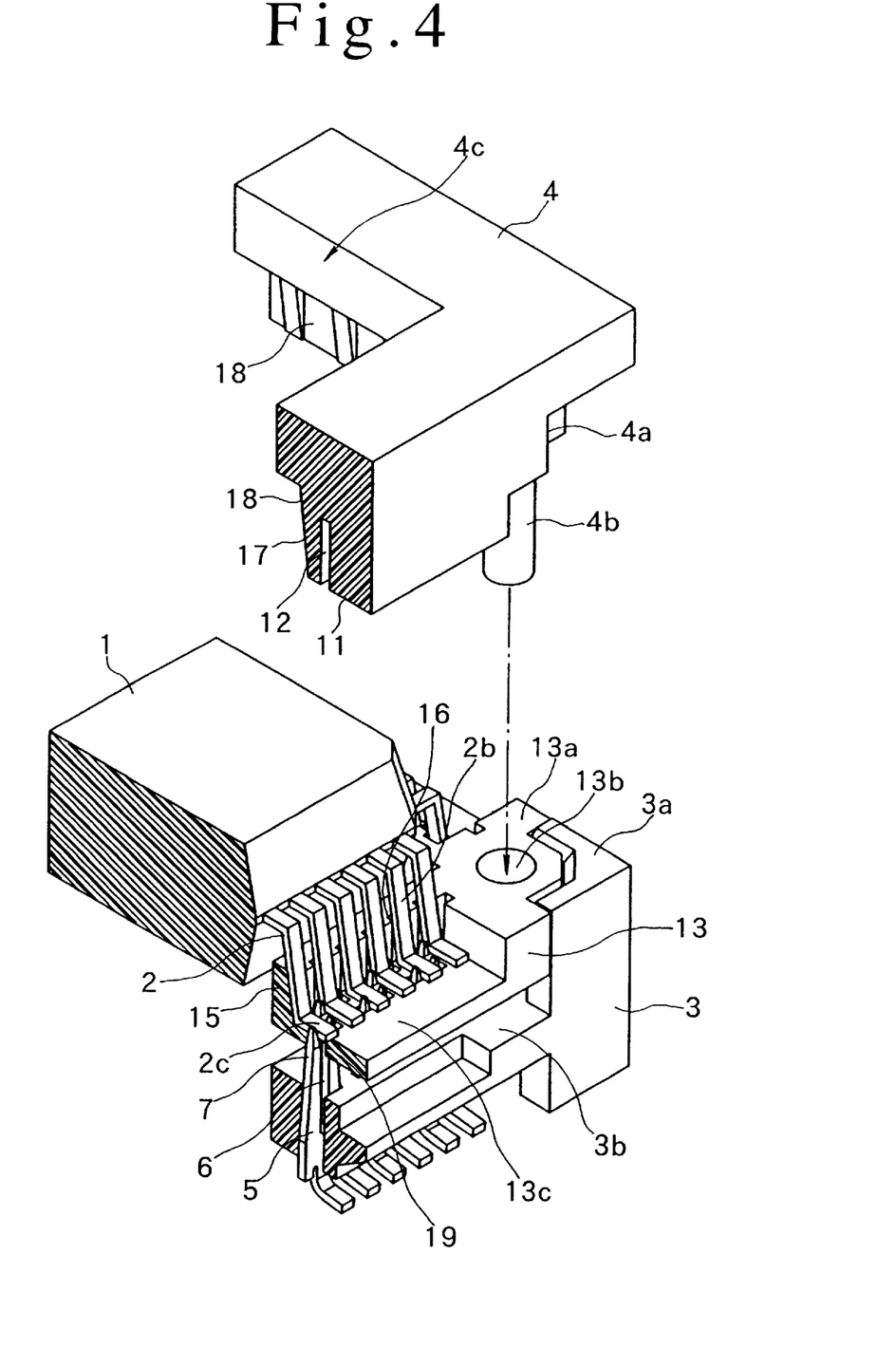
FIG. 4 is a perspective view showing an essential portion of FIG. 3 on an enlarged scale.

As shown in FIGS. 3 and 4, the flat type IC package 1 is placed on the IC mount 13 which is engaged with the socket 3, and a lower surface of the distal end portion 2c of each IC lead 2 is supported by the lead supporting seat 3c of the IC mount 13 in such a manner as to be astride the through-holes 19 with the lower surface of the lead distal end portion 2c confronting the lead inlet port 20, i.e., the opening end of the vertical slit 6. That is, the lead 2 is placed on and contacted with the lead supporting seat 13c with a part of an extending portion of the lead distal end portion 2c located on the through-hole 19.

Figure 10A:
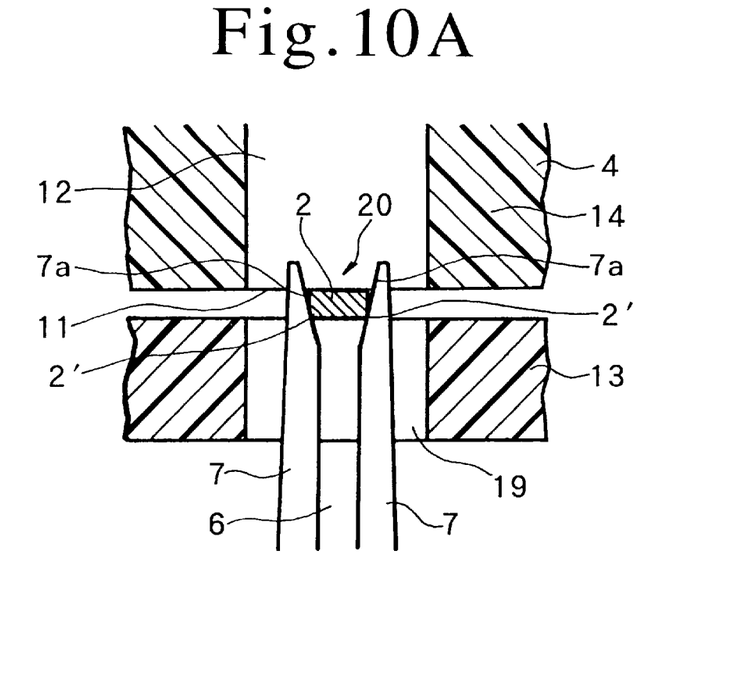
FIG. 10(A) is a sectional view of an essential portion for explaining a state before the IC leads are pushed into the contacts.
Figure 10B:
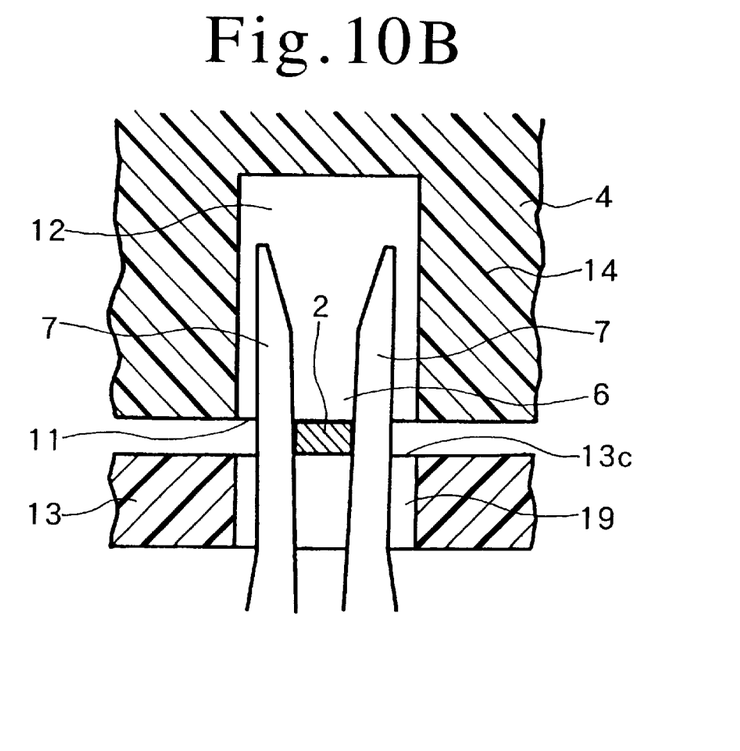
FIG. 10(B) is a sectional view of the essential portion for explaining a state after the IC leads have been pushed into the contacts.

As shown in FIGS. 3 and 4, the distal end portions of the contacts 5 are allowed to project through the through-holes 19 or through-grooves and above the seat 13c. As shown in FIG. 10(A), lower corners 2 of the lead distal end portions 2c are carried by the slanted surfaces 7a at the distal ends of the two resilient contact elements 7 and, at the same time, the rear surfaces of the lead intermediate portions 2b are restricted by an outer surface of a lead restricting wall extending over the direction of the array of the IC leads 2 along the inner edge of the lead supporting seat 13c of the IC mount 13 , i.e., the inner edge of the frame forming the IC mount 13, thereby correctly positioning the IC leads 2 with respect to the corresponding contacts 5.

As shown in FIG. 5, the presser member 4 for pressing down the IC leads 2 is placed on the IC mount 13. At that time, the positioning pin 4b projecting from each corner of the presser member 4 is inserted into the hole 13b formed in the socket engagement portion 13a of the IC mount 13, so that the presser member 4 is correctly positioned with respect to the IC mount 13. By this, the lead distal end portion 2c of the IC lead 2 is held between the lead presser portion 11 of the presser member 4 and the lead supporting seat 13c of the IC mount 13. At the same time, an upper portion of the body of the IC package 1 is received in a frame window 4c of the presser member 4 and a lower portion of the body of the IC package 1 is received in a frame window 13d of the IC mount 13, such that the upper and lower surfaces of the IC package body are exposed outwardly.

On an inner side of the lead presser portion 11, of the presser member 4, a lead restricting surface 17 is formed in such a manner as to confront the front surface of the IC lead intermediate portion 2b, so that the front surface of the lead intermediate portion 2b is restricted by the restricting surface 17. Accordingly, the lead intermediate portion 2b is interposed between the lead restricting surface 17 and a lead restricting surface of a lead restricting wall 15 of the IC mount 13 to ensure correct positioning. In order to ensure the positioning effect, positioning grooves 16, 18 for receiving therein the lead intermediate portion 2c are formed in one or both of the lead restricting surface of the lead restricting wall 15 and the lead restricting surface 17 of the lead presser portion 11, so that the IC leads are prevented from being displaced. At the same time, an angular portion of the lead presser portion 11, formed at a junction between the lead pressing surface and the restricting surface 17, restricts an angular portion formed at a junction between the lead intermediate portion 2b and the lead distal end portion 2c, so that correct positioning is further ensured.

The lead presser portion 11 is provided with contact receiving grooves 12 which open at the pressing surface. The contact receiving grooves 12 are formed in such a manner as to confront the corresponding contacts 5 implanted in the socket 3. The contact receiving grooves 12 receive therein the distal end portions of the contacts 5 when inched out (or protruded) upwardly from the through-holes 19 of the IC mount 13 in accordance with the pressing down operation applied to the IC leads 2, and this promotes the entry of the leads 2 into the vertical slits 6 when pressed by the lead presser portion 11.

Partition walls 14 are provided between the contact receiving grooves 12. When the lead presser member 11. presses the IC leads 2 into the vertical slits 6, the partition walls 14 are interposed between the contacts 5, i.e., between the resilient contact elements 6 of the adjacent contacts 5 so that the contacts 5 are prevented from forming a short circuit therebetween.

Figure 7A:
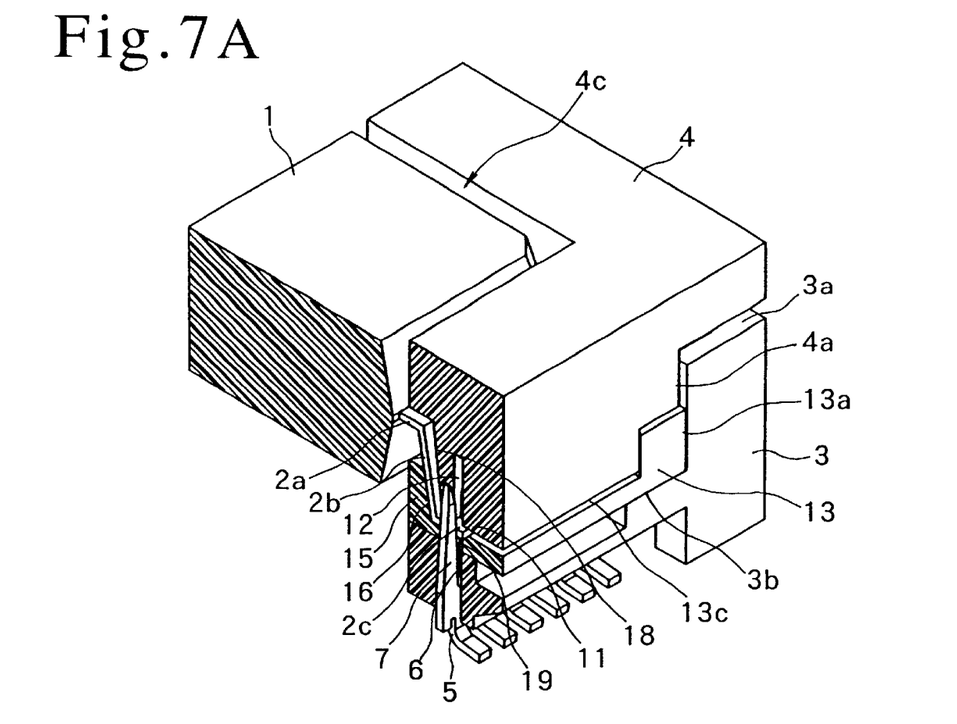
FIG. 7(A) is a perspective view showing the essential portion of FIG. 6(A) on an enlarged scale.
Figure 7B:
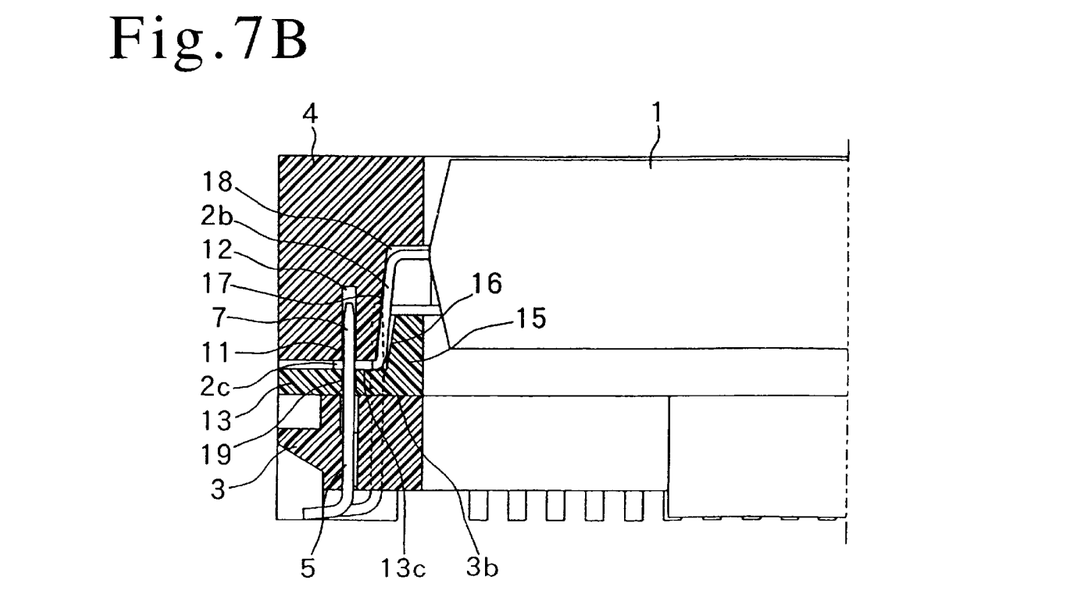
FIG. 7(B) is a sectional view of FIG. 7(A)

As shown in FIGS. 7(A), 7(B) an d 8(B), when the upper surfaces of the IC leads 2 are pressed by the presser member 4 while being supported by the IC mount 13, the corner portions of the IC mounts 13 are slidably engaged with the mount engagement portions 3a of the IC socket 3. As a consequence, guided by the mount engagement portion 3a, the IC mount 13 is slid downwardly together with the IC package 1 and the presser member 4; that is, the presser member 4, the lead presser portion 11 and the IC mount portion 13 are pressed downwardly in the state in which the IC leads 2 of the IC package 1 are held between the IC mount 13 and the presser member 4. In accordance with the pressing down operation, the distal end portions of the contacts 5 are inched out (or protruded) upwardly from the through-holes 19 of the IC mount 13 and, at the same time, these distal end portions are received in the receiving grooves 12 of the lead presser portion 11, whereas an intermediate part of the extending length of each IC lead 2 is pushed into the vertical slit 6 of the contact 5, thereby achieving the contacting state of FIGS. 6(B) to 10(B).

As mentioned above, each contact 5 is inched out (or protruded) upwardly from the through-hole 19, and the lead distal end portion 2c is pushed into the vertical slit 6. By pushing the lead 2 into the vertical slit 6, the resilient contact element 7 is dilated against its resiliency such that it firmly retains the opposing two side surfaces of the IC lead 2 by its reaction force. The concept of the expression "inched out" includes a first case where in a state not yet pressed down, the distal end of the contact 5 is inched out (or protruded) from the interior of the through-hole 19 or through-groove of the IC mount 13 and a second case where the distal end of the contact 5 is inched (or protruded) upwardly from the projected position onto the IC mount 13 from the through-hole 19 or through-groove.

In pressing down the IC lead 2, the lead presser portion 11 of the presser member is designed to apply a pressing force to an upper surface of a portion of the lead distal end portion 2c adjacent to the vertical slit 6, which lead distal end portion 2c projects from the vertical slit 6, so that the least possible pushing load can be applied to the IC lead 2. The array of the IC leads 2 are held between the IC mount 13 and the presser member 4 and pushed into the vertical slits as one group so that the leads 2 are prevented from being deformed during the push-in operation.

The push-in operation of each IC lead 2 into the vertical slit 6 is completed when the lower surface of the IC mount 13 is loaded on the mount supporting seat 3b formed on the upper surface of the frame of the socket 3. By this, a contacting position between the array of the IC leads 2 and the array of the contacts 5 is obtained. That is, when the IC lead 2 is pushed into the vertical slit 6 by a predetermined amount, the lower surface of the IC mount 13 is supported by the mount supporting seat 3b, so that the push-in depth of the IC lead 2 is established by the lead presser portion 11. In other words, a contacting position L between the IC lead 2 and the resilient contact elements 7 is established in a constant position of the extending length of the vertical slit 6, so that the contacting positions of individual IC leads 2 with respect to the individual contacts 5 are made uniform (equivalent in inductance). At that time, the IC mount 13 is prevented from moving upwardly by the slide contact, such that the pressed-down state of the IC mount is maintained and the pushed-in state of the lead 2 is also obtained. In the pushed-in state, the push-up force exerted by the contact 5 is not applied to the IC mount 13 and the presser member 4 at all.

Figure 8:
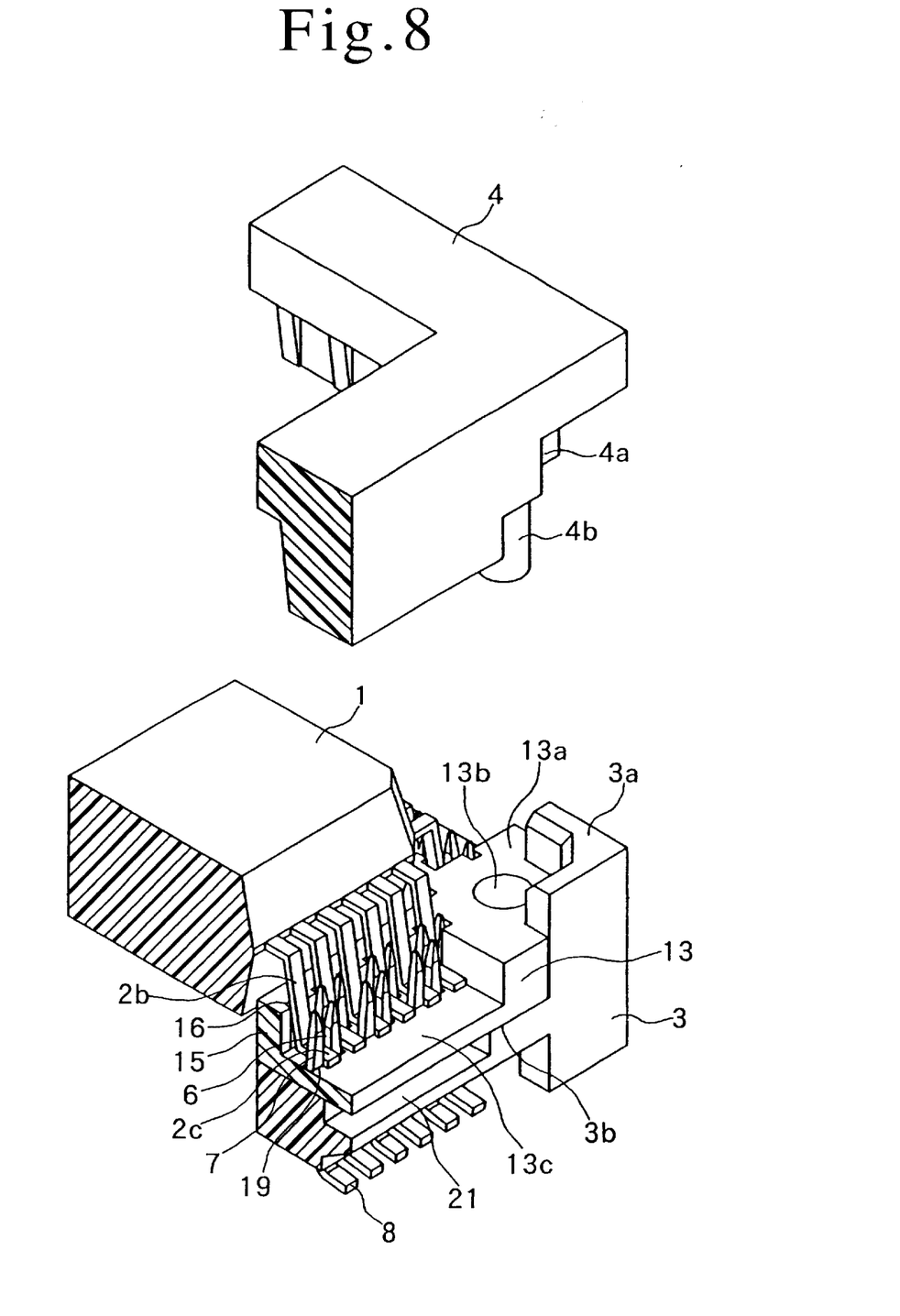
FIG. 8 is a perspective view showing an essential portion of FIG. 6(B) on an enlarged scale.

The IC lead 2 is pressed at the lead distal end portion 2c into the vertical slit 6 of the contact 5 implanted in the socket 3. Depending on the arrangement of the contacts or the configuration of the IC leads, each IC lead 2 can be pressed into the vertical slit 6 not only at its distal end portion 2c but also at its intermediate portion 2b or at its basal portion 2a. For example, as shown in FIGS. 7B, 8 and 9A, it is accepted that the contacts 5 are arranged in array in staggered relation, so that the distal end portion 2c of each IC lead 2 is held by the contact 5 in the outer array and a connecting portion between the lead distal end portion 2c and the lead intermediate portion 2b or the lead intermediate portion 2b is held by the contact 5 in the inner array.

As means for releasing a contacting relation between the IC lead 2 pressed into the vertical slit 6 of the contact 5 and the contact 5, a tool receiving portion 21 formed of a recess portion is provided on the IC mount 13 or the socket 3.

Specifically, a recess portion, which is open at the mount supporting seat 3b and also open sidewardly of the socket 3, is provided on an end edge portion of the socket 3, so that the tool tip receiving portion 21 is defined by the recess portion. In other words, a recess portion, which confront s the lower edge portion of the IC mount 13, is open sidewardly of the socket 3. In the alternative, the tool tip receiving portion 21 formed of the recess portion which is open sidewardly of the IC mount 13 is formed on an end edge portion of the IC mount 13. It is also an interesting alternative that a recess portion, which confronts the mount supporting seat 3b of the socket 3 and opens sidewardly of the IC mount 13, is formed on a lower edge portion of the IC mount 13.

A plurality of the tool tip receiving portions 21 are disposed on four sides or two opposing sides of the socket 3 or the IC mount 13, so that the tool tips are inserted into the tool tip receiving portions 21 to push or pull up the IC mount 13. By doing so, the IC leads 2 are removed from the vertical slits 6 of the contacts 5 as a group, to thereby release the contacting relation between the contacts 5 and the IC leads 2. That is, the IC mount 13, the IC package 1 and the presser member 4 are pushed or pulled up as a group by the tool tips. By this, the array of the IC leads 2 are removed while supporting the IC leads 2 on the lead supporting seat 13a of the IC mount 13, so that the IC leads 2 are prevented from being deformed during the removing operation.

Accordingly, the flat type IC package 1 is easily removed from the socket 3 together with the IC mount 13 and the presser member 4 by the pushing-up operation. Through co-action between the IC mount 13 and the presser member 4, the flat type IC package 1 is reloaded onto the socket 3 and the IC leads 2 are pressed into the corresponding contacts 5 again.

Figure 11:
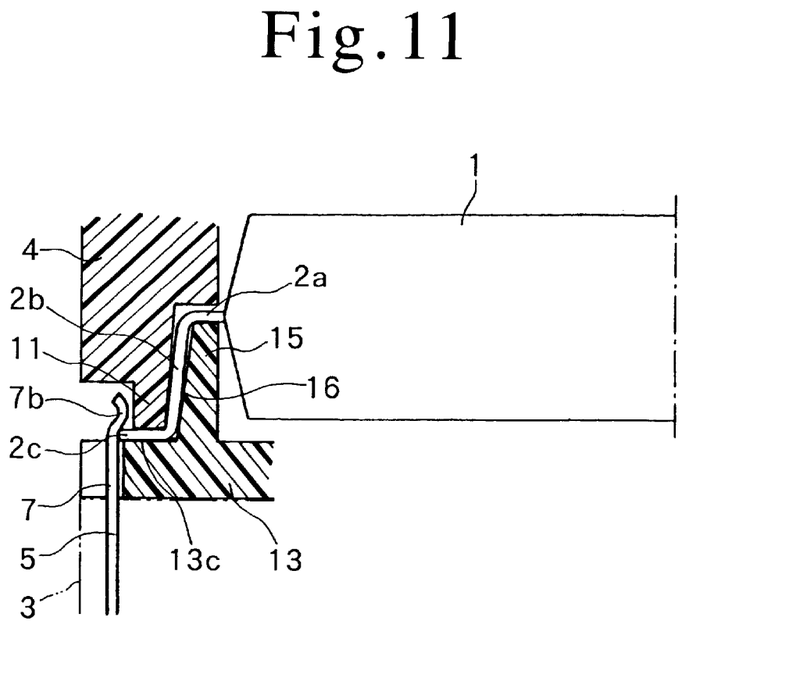
FIG. 11 is a sectional view of a socket for a flat type IC package according to another embodiment of the present invention.

FIG. 11 shows another embodiment of an IC socket for a flat type IC package. Referring to the description common with the preceding embodiment, this embodiment will now be described.

As shown in FIG. 11, between the socket 3 with the contacts 5 implanted therein and the presser member 4, an IC mount 13, which is not mechanically connected to the socket 3 and the presser member 4, is upwardly and downwardly movably interposed.

The IC mount 13 is upwardly and downwardly movably interposed between the socket 3 and the presser member 4 without being mechanically connected thereto by a spring, a pin or the like, so that the IC mount 13 can be attached and detached with respect to the presser member 4 and the socket 3. Each contact 5 implanted in the socket 3 includes a resilient contact element 7 extending upwardly from an implanting portion of the socket 3 and has an angular contact portion 7b on a distal end portion of the resilient contact element 7. The contact 5 can be resiliently displaced inwardly and outwardly about the implanting portion.

The flat type IC package 1 is placed on the IC mount 13 and the lead distal end portion 2c of the IC lead 2 is supported by the lead supporting seat 13c of the IC mount 13. At the same time, the back of the lead intermediate portion 2b is restricted by a lead restricting surface 16 of a lead restricting wall 15 disposed along an inner side edge of the lead supporting seat 13c of the IC mount 13, that is, along an inner edge of the frame forming the IC mount 13 along the direction of the array of the IC leads 2, so that the IC leads 2 are correctly positioned with respect to the corresponding contacts 5.

The presser member 4 for pressing down the IC leads 2 is placed on the IC mount 13. With respect to the presser member 4 and the structure for positioning and pressing down the IC leads 2 by the presser member 4 and the IC mount 13, please refer to the corresponding description of the preceding embodiment.

Each IC lead 2 is pressed down together with the IC mount 13 by the presser member 4. In accordance with this pressing down operation, the distal end portion of each contact 5 is inched out (or protruded) upwardly from the IC mount 13, and a lower edge of an end face of the lead distal end portion 2c is slidably contacted with an angular slanted surface of the distal end contact portion 7b of the contact 5. At the same time, while deflecting the resilient contact element 7 outwardly, the IC lead 2 is pressed into the contact 5 so that the IC lead 2 is retained in a contact relationship in place immediately under the distal end contact portion 7b of the contact 5.

As means for releasing the contacting relation, a tool tip receiving portion 21 formed of a recess portion as described in the preceding embodiment is provided on the IC mount 13 or the socket 3. The IC mount 13 is pushed up by inserting the tool tip into the tool tip receiving portion 21. By doing so, the lead distal end portion 2c climbs over the distal end contact portion 7b of the contact 5 while deflecting the resilient contact element 7 to allow the IC leads 2 to be removed. By this, a contact relation with the contact 5 is released. At that time, the contact relation is released while supporting the lower surfaces of the IC leads 2 by the lead supporting seat 13a, so that the leads 2 are prevented from being deformed during the removing operation.

Accordingly, the flat type IC package 1 is easily removed from the socket 3 together with the IC mount 13 and the presser member 4. Through co-action between the IC mount 13 and the presser member 4, the flat type IC package 1 is reloaded onto the socket 3 and the IC leads 2 are pressed into the corresponding contacts 5 again.

The IC package 1, with each IC lead 2 pressed into the contact 5 in the manner as mentioned above, is retained between the socket 3 and the presser member 4 and in that state, or in a state where the presser member 4 is removed, the IC package 1 is placed on the wiring circuit board 9 and thermally welded to the pads 10 on the surface of the circuit board at a surface mount element 8 of the contact 5 through a conductive paste.

According to the present invention, each IC lead is pressed down by the presser member together with the IC mount which is upwardly and downwardly movably interposed between the socket and the presser member. In accordance with the pressing down operation, the distal end portion of the contact is inched out (or protruded) upwardly from the through-hole or through-groove of the IC mount. At the same time, the IC lead is pressed into the vertical slit of the contact. By doing so, the IC leads as a group can be reliably contacted with and retained by the corresponding contacts. Furthermore, by pushing up the IC mount, the IC leads can be removed from the vertical slits of the contacts as a group. Accordingly, the IC leads can be prevented from being deformed during the removing operation and the IC package can easily be removed from the socket.

The problem that the presser member tends to be warped by reaction of the contacts during the pressing operation such that reliability of contact relation is degraded as often conventionally experienced, can be obviated.

Before the pressing down operation of the IC leads, each IC lead is correctly positioned by the lead inlet port of the contact open at the IC mount and the distal end of the contact inching (or protruding) out during the pressing down operation is received in the receiving groove of the presser member. By doing so, the pressing-in operation of the IC lead can be performed correctly and properly.

At that time, the lower surface of the IC mount is carried on the mount support seat. By doing so, the pressing-in amount of the lead into the vertical slit, that is, a contact position of the lead relative to the contact can normally be maintained constant, so that the inductance component can be made uniform.

Compared with the conventional contacting structure in which each IC lead is caused to overlie and contact the horizontal U-shaped resilient contact element, the signal line length from a contact point of the IC lead in the vertical slit to a contact point with respect to the wiring circuit board of the contact is greatly reduced. This is quite effective as a countermeasure for offsetting the inductance component and the requirement for high frequency.

The IC mount and the presser member, and those two members and the socket are not mechanically connected by a spring, a pin or the like. Instead, the IC mount and the presser member are slidably contacted with and engaged with the mount engagement portion of the socket. Accordingly, after each IC lead is contacted with and retained by the contact through the above-mentioned pressing in operation, the pressure member can be removed without any inconvenience. Also, merely by pushing up the IC mount by inserting the tool tip into the tool tip receiving portion of the IC mount or the socket, the contacting relation of the IC leads with the contacts can be released without deforming the IC leads, and the IC package can easily be removed from the socket.

Although this invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. An IC socket device for an IC package having IC leads, comprising:

a socket body;

contacts mounted in said socket body so as to extend generally upwardly, each of said contacts having a generally upwardly extending slit formed therein;

a presser member mounted over said socket body for movement relative to said socket body between a raised position and a lowered, pressing position;

an IC mount interposed between said socket body and said presser member, said IC mount having a lead supporting seat for supporting the IC leads of the IC package, and said IC mount having through-holes formed therein and opening through said lead supporting seat for receiving said contacts therethrough;

wherein said presser member has an IC lead presser portion and downwardly-opening receiving grooves formed therein for receiving distal ends of said contacts; and wherein said IC mount is interposed between said socket body and said presser member so as to be upwardly and downwardly movable relative to said socket body and said contacts, such that upon downward movement of said presser member towards said lowered, pressing position, said IC mount is pressed downwardly to cause the distal ends of said contacts to protrude increasingly upwardly from said through-holes and into said receiving grooves of said presser member and so as to cause the IC leads, when supported on the IC lead supporting seat, to be pushed into said slits of said contacts.

2. An IC socket device according to claim 1, wherein in a state in which said IC mount is pressed down and said distal ends of said contacts are projected from said throughholes of said IC mount, upper ends of said slits of said contacts are open above said IC lead supporting seat of said IC mount to define IC lead inlet ports.

3. An IC socket device according to claim 1, wherein said socket body includes a mount supporting seat for defining a lowest position of said IC mount and thereby defining an insertion depth of the IC leads into said slits of said contacts.

4. An IC socket device according to claim 1, wherein said socket body is provided with a mount engagement portion for slidably engaging a corner portion of said IC mount to guide upward and downward movement of said IC mount, so that the upward and downward movement of said IC mount is restricted when said mount engagement portion is slidably engaged with said corner portion of said IC mount.

5. An IC socket device according to claim 1, wherein one of said IC mount and said socket body is provided with a tool tip receiving portion for receiving a tool used for pushing said IC mount upwardly.

* * * * *